US005348934A

United States Patent [19]

Shaw

[11] Patent Number: 5,348,934

[45] Date of Patent: Sep. 20, 1994

[54] SECONDARY EMISSION CATHODE HAVING SUPECONDUCTIVE OXIDE MATERIAL

[75] Inventor: Beverley A. Shaw, North Reading, Mass.

[73] Assignee: Raytheon Company, Lexington, Mass.

[21] Appl. No.: 756,407

[22] Filed: Sep. 9, 1991

[51] Int. Cl.[5] ........................ H01J 23/05; H01J 25/42; H01J 19/06; H01L 39/12

[52] U.S. Cl. .................................... 505/125; 505/700; 505/100; 505/200; 315/39.3; 315/5.33; 315/5.11; 313/346 R; 313/103 R; 330/42; 252/521

[58] Field of Search .................... 315/5.11, 5.12, 5.33, 315/39.3, 39.51, 39.63, 39.67, 39.75; 313/103 R, 106, 346 R; 252/521; 330/42, 47; 331/89; 505/1, 700

[56] References Cited

U.S. PATENT DOCUMENTS

| | | | |
|---|---|---|---|
| 2,400,770 | 5/1946 | Mouromtseff et al. | 313/103 |
| 2,411,601 | 11/1946 | Spencer | 331/89 |
| 2,504,187 | 4/1950 | Derby | 315/39.63 X |
| 2,640,169 | 5/1953 | Nevin | 313/103 |
| 3,096,457 | 7/1963 | Smith, Jr. et al. | 313/103 |
| 3,982,152 | 9/1976 | Smith | 315/3.5 X |
| 4,677,342 | 6/1987 | MacMaster et al. | 315/39.3 |
| 5,015,920 | 5/1991 | Blanchard | 315/5 X |

OTHER PUBLICATIONS

Dallos, A., B. H. Smith, and C. Bowness, Simulation of Rod Charging in TWT Helix Structures, 1989 IEEE, pp. 8.4.1–8.4.4.

*Primary Examiner*—Robert J. Pascal
*Assistant Examiner*—Benny T. Lee
*Attorney, Agent, or Firm*—Richard M. Sharkansky

[57] ABSTRACT

A cathode for a secondary emission structure comprised of a superconductive material is described. In one embodiment the cathode comprises a layer of a superconductive material such as yttrium barium cupric oxide, or rare earth substituted neodymium cupric oxides. The layer may be bonded to a metal electrode or preferably the cathode consist of a superconductive or conductive oxide. The use of a superconductive material provides a cathode having suitable secondary emission characteristics and, furthermore, which being conductive at room temperatures, as well as, temperatures of operation of the cathode, obviating the need for a use of a very thin film of a secondary emission material.

10 Claims, 4 Drawing Sheets

SECONDARY EMISSION CATHODE HAVING SUPECONDUCTIVE OXIDE MATERIAL

BACKGROUND OF THE INVENTION

This invention relates generally to cathode structures and more particularly to cathode structures exhibiting secondary emission.

As is known in the art, certain microwave tube devices such as high power crossed-field amplifiers generally include a cathode which is capable of supporting secondary emission of electrons and thus which is capable of providing high current density and high power capabilities.

One type of conventional cathode structure capable of secondary emission generally includes a metal which is capable of exhibiting sufficient secondary emission. Examples of metal materials which are often used as secondary emission cathodes include platinum and tungsten. These materials have a ratio of secondary emission to primary emission which is suitable for some applications, although for most applications the ratio is generally too low.

Another type of material which is suitable for secondary emission is certain metallic dielectric oxides such as beryllium oxide, magnesium oxide, and aluminum oxide. These insulator type of oxides exhibit reasonably high ratios of secondary emission to primary emission. One problem with these materials, however, is that they cannot be used in bulk form since they are electric insulators. Since they are insulators, impinging electrons charge the surface of the metallic oxide effectively stopping the secondary emission process. One approach to overcome this limitation is to provide cathodes made of a metal having a thin film of such oxides thereover with the film having a thickness of approximately 50Å. Thin films on the order of 50Å disposed over the metal cathode permit impinging electrons to tunnel through the insulative film and be collected by the metal cathode structure. With the metallic oxide layer the composite cathode is capable of providing a high current density (approximately 1 to 10 amperes per square centimeter). Therefore these films are suitable for use as secondary emission cathodes in crossed-field high power tubes.

One problem with this approach, however, is that since these films are very thin, the thin oxide films are eroded away by the electron bombardment over a relatively short period of time. Therefore such cathodes have a limited lifetime in applications as a cathode in a crossed-field high-power amplifier tube. As mentioned above, the process by which charge is leaked off of these thin films is to the film thin such that tunneling of impinging primary electrons can be provided through the film to the conductive electrode which supports the film. One approach which has been used to overcome the problem of erosion of these thin films is to provide the conductive electrode as a layer of the metal used in the selected secondary emitter metallic oxide layer and to also manufacture the tube with a in-situ oxidizer which permits reformation and rehealing of the oxide film during tube operation. This approach while acceptable for tube operation is, nevertheless, costly to incorporate into the tube. Further, the in-situ approach occupies space in the tube. An additional problem with these films is that the films require an extensive period of time for out-gassing of impurities during manufacture of the tube in order to allow them to be used at high powers.

Thus, in order to increase the longevity of the cathode, but not necessarily improve the out-gassing problem, thicker films for the cathode would be desired. Thicker films, however, are not readily useable since the thicker films will introduce problems with respect to the effective conductivity of the composite cathode which will result in the charging effects within the films, as mentioned above, and thus provide a reduction of the available current density relative to that obtained from the very thin insulating films.

One solution to this problem has been to obtain greater electronic conduction in such thick insulating films by introducing conductive metallic particles into the insulating film. In particular, one example of such a material is magnesium oxide containing gold particles. The metallic particles result in improved conductivity of the material, however, the presence of the metallic particles also provides a significant degradation in the secondary emission ratio. Moreover, the slight increase in thickness allowed by the addition of metallic particles does not adequately meet the requirements for a cathode having a relatively long lifetime.

SUMMARY OF THE INVENTION

In accordance with the present invention, a cathode capable of supporting secondary emission includes a layer of a conductive metal oxide and preferably a superconducting metal oxide which has a relatively high conductivity at elevated temperatures of operation of the cathode and has a relatively high secondary emission ratio. With such an arrangement, by providing a cathode comprised of an oxide which is electrically conductive at elevated temperatures such as temperatures comparable to the operating temperatures of the cathodes in a crossed-field amplifier tube, the need for a thin insulating type of oxide layer is obviated. Therefore, the absence of a requirement for a thin film will permit, in one embodiment, thicker films of such material to be used over a conductive metallic electrode thus improving lifetime of the composite electrode while permitting charge to leak off from the cathode. Preferably, the cathode is a solid piece of the conductive oxide without a metallic electrode. This arrangement obviates the need for bonding or otherwise disposing the conductive oxide to a metal. With either approach, cathodes which exhibit secondary emission are provided for use in high-power crossed-field tubes. Such cathodes will exhibit relatively long life-times. Further, by using thick layers or a solid piece of the material as the cathode, this arrangement obviates the need for an in-situ oxidizer. Moreover, such a structure may also be used in other types of applications requiring cathodes which exhibit secondary emission.

In accordance with a further aspect of the present invention, a crossed-field tube comprises a cathode comprised of a superconducting material having a secondary emission ratio greater than 1 and an anode having a slow wave structure disposed adjacent said cathode to provide an interaction space between said slow wave structure and said cathode and waveguide means connected to said slow wave structure for coupling into and out of said tube. With such an arrangement, by providing a cathode comprised of a superconducting material which is conductive at the operating temperature of the crossed-field tube, the crossed-field tube is provided having a cathode which will have a relatively long lifetime characteristic without the need of an in-situ oxidizer.

Further, such superconducting oxides, although not superconducting at the operating temperature of the tube nevertheless exhibits sufficient conductivity to permit charge to be removed from the cathode without the need for a metal cathode base as in the case of the Be/BeO secondary emitter composite cathode. Further still, certain of the superconducting oxides exhibit a relatively high ratio of secondary to primary emissions over a broad range of applied voltages. This latter characteristic is particularly desirable since this allows more degrees of freedom in designing and operating such secondary emission type devices.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
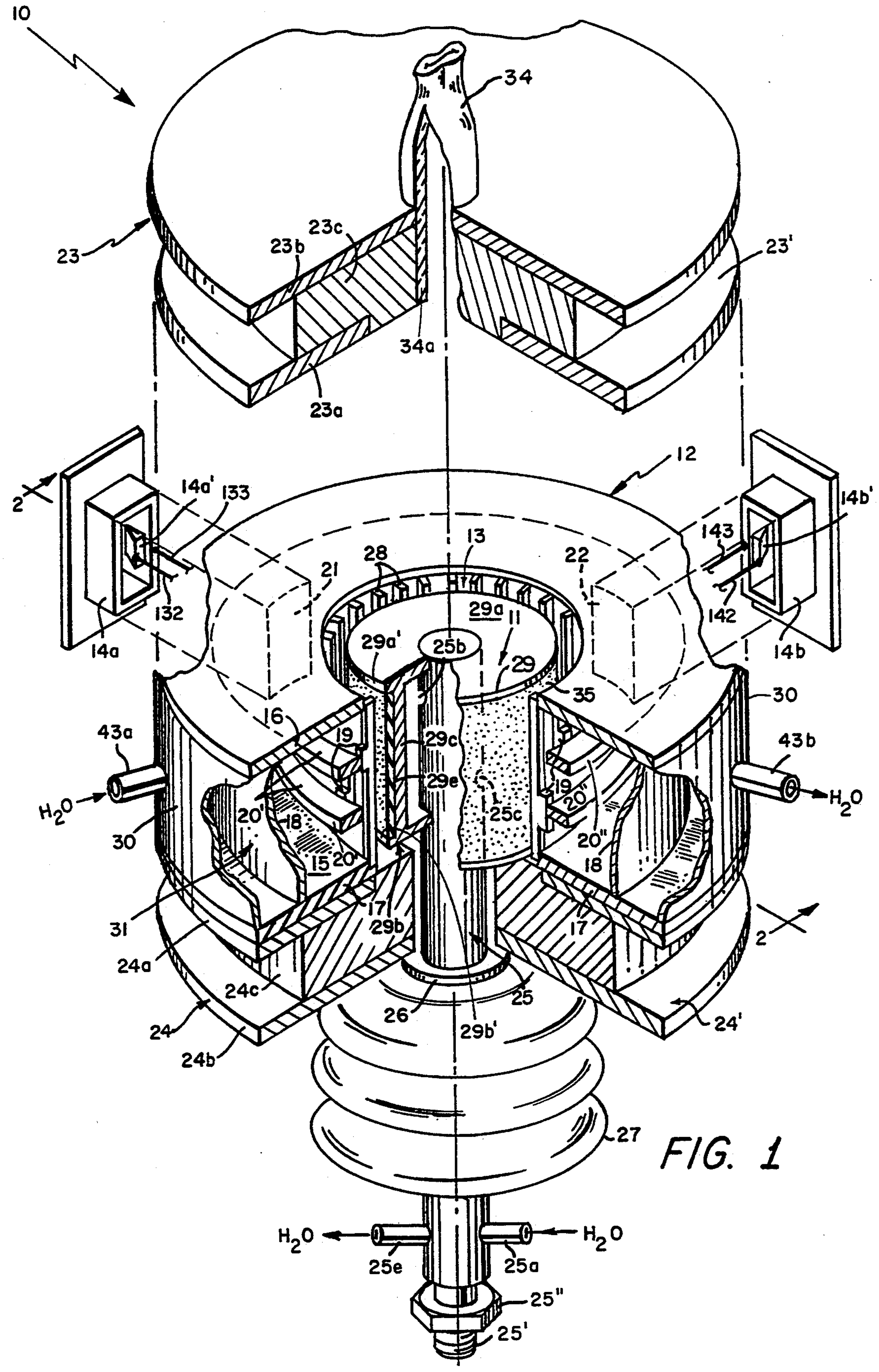
FIG. 1 is a partial cross-section, partially exploded isometric view of a crossed-field tube having a cathode in accordance with the present invention.
Figure 2:
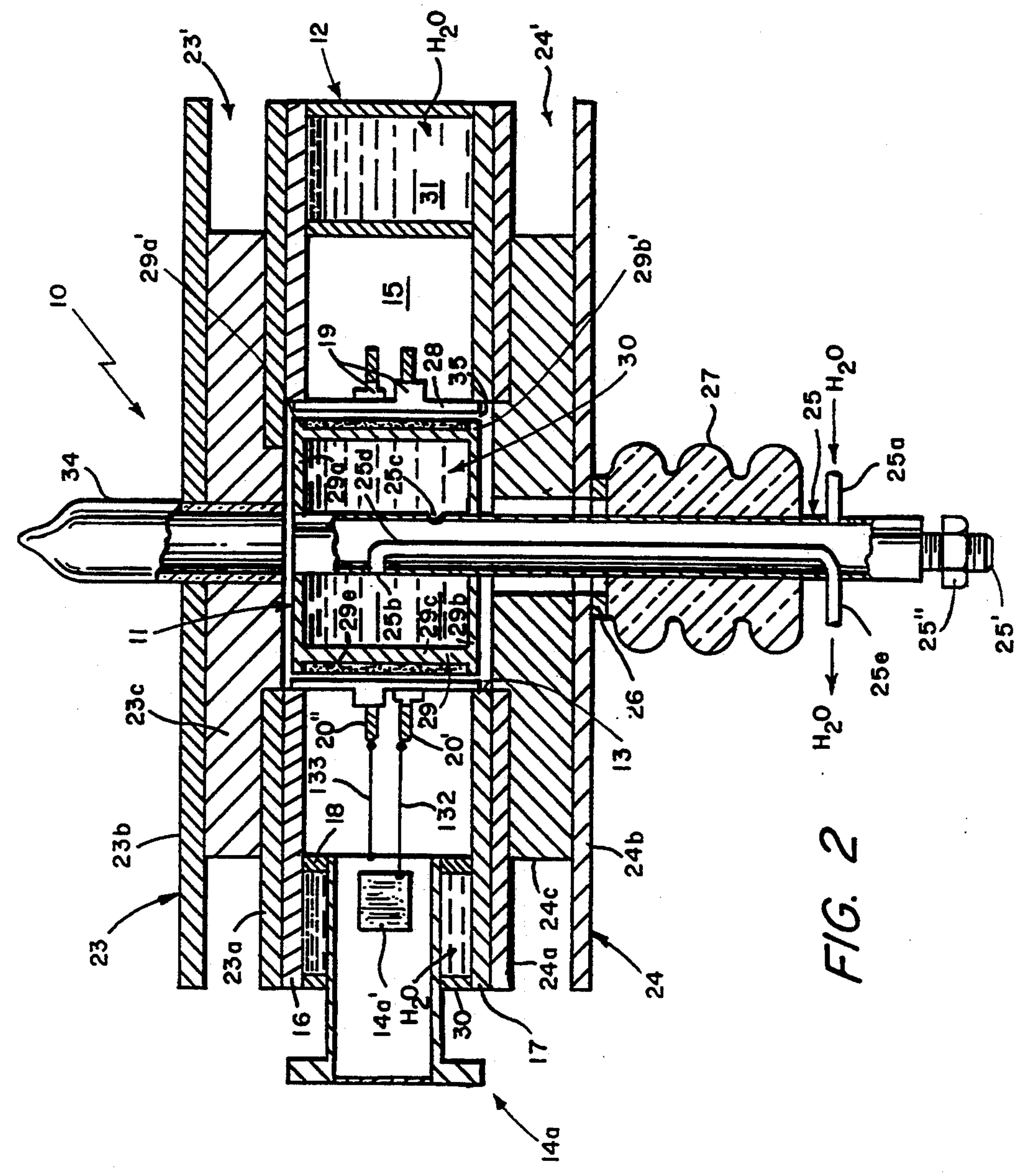
FIG. 2 is a cross-sectional view of the assembled tube of FIG. 1 taken along line 2—2 of FIG. 1.

Referring now to FIGS. 1 and 2, a crossed-field amplifier tube 10 is shown to include a central cathode structure 11 spaced from an anode 12 by an interaction region 13, as shown. Anode 12 has an input waveguide section **14*a* and an output waveguide section 14*b* (FIG. 1) each of which are coupled through sidewalls 30 of the anode 12. The anode 12 has a cavity 15 provided by upper and lower walls 16, 17, respectively, outer wall 18 and further having vanes 28 extending parallel to the axis of symmetry of the tube 10. The vanes 28 also extend radially and are attached at their ends to the upper and lower walls 16, 17, respectively. Each vane has a radially extending tab 19 and the tabs 19 are longitudinally disposed from each other adjacent vanes with alternative vanes having their respective tabs 19 in the same longitudinal plane. The crossed-field amplifier tube 10 here has mode suppression rings 20′, 20″ (FIG. 1) displaced longitudinally from each other to correspond with the longitudinal displacement of the tabs and which are attached to the tabs 19 in their respective planes. The rings 20 each have a gap (not shown) in the region between the input and output waveguides respectively. The waveguides shown in FIG. 1 are connected to the wall of the cavity 15 at apertures 21, 22**, respectively as shown.

Each waveguide contains an impedance matching wedge **14*a*′, 14*b*′(FIG. 1), also respectively as shown. The wedges 14*a*′, 14*b*′ may assume other forms such as a stepped ridge as well as other types known to those skilled in the art. Each wedge 14*a*′, 14*b*′ is electrically connected via a wire 132, 142, respectively to a different one of the mode suppression rings 20′, 20″, as shown in FIGS. 1 and 2. Further another wire 133, 143 (FIGS. 1 and 2) is connected between each wedge 14*a*′, 14*b*′ and the other ring 20″, 20′**, respectively.

Since the tube 10 is evacuated, each of the waveguides contain a vacuum seal 34, as shown in FIG. 1 and 2. The upper wall 16 and the lower wall 17 of cavity 15 have a magnetic structure 23, 24 brazed to them respectively in order to provide a structure which will provide a longitudinal directed magnetic field when connected to a magnet (not shown). The magnetic structure 23 comprises two circular steel plates **23*a*, 23*b* brazed to a soft iron (magnetically permeable) disk 23*c*. A vacuum tube 34*a* which can support the vacuum within the tube 10 extends out beyond a central opening in the magnetic structure 23 and is sealed after the evacuation of an assembled tube 10. Magnetic structure 24 having plates 24*a*, 24*b*, and disk 24*c* is attached to a lower wall 17 of cavity 15. Magnetic structure 24 has a hole in its center through which a cathode support pipe 25 A disk 26 provides a vacuum seal between the lower steel plate 24*b* of structure 24 and a high voltage support insulator 27. Insulator 27 is also bonded to cathode support pipe 25 with a vacuum insulating seal. Thus, a tube 10**, as shown in FIGS. 1 and 2, is a vacuum-tight structure.

The cathode structure 11, shown in FIGS. 1 and 2 as referred to above, includes the cathode support pipe 25, mentioned above, which is attached to a cylindrical spool 29 having upper and lower wall surfaces **29*a*, 29*b* each of which having edges 29*a*′, 29*b*′ which protrude beyond a cylindrical wall 29*c* of spool 29 to provide a recess within which is contained a secondary emitter cathode material 29*e*. Thus, the cylindrical wall portion 29*c* of cathode 11, as well as wall surfaces 29*a*, 29*b*, are comprised of a highly conductive metal, such as gold or platinum, over which is deposited a relatively thin layer 29*e* of a conductive oxide preferably a superconducting oxide material which exhibits suitable secondary emission characteristics. Although any thickness could be used such as the typical 50Å thickness used with prior art arrangements, it is generally preferred that the layer be relatively thick on the order of several microns. The layer 29*e* could be sputtered on spool 29, or alternatively the layer 29*e* could be deposited onto spool 29** by a chemical vapor deposition technique.

Figure 1A:
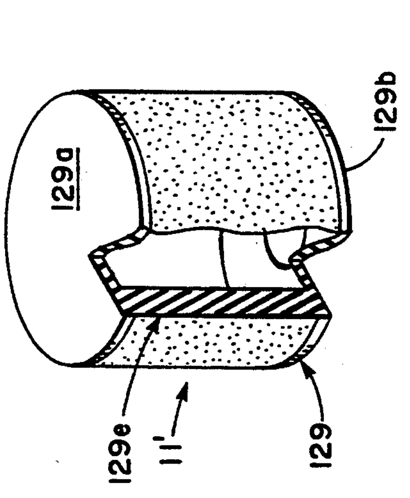
FIG. 1A is an isometric view of an alternate embodiment for a cathode for use in the tube of FIG. 1 in accordance with a further aspect of the present invention.

An alternative arrangement for a cathode 11′ is shown in FIG. 1A. Here cathode 11′ has a cylindrical spool 129 and has upper and lower wall surfaces **129*a*, 129*b* and secondary emitter electrode 129*e*** all comprised of a solid piece of a selected conductive and preferably superconductive oxide such as those to be mentioned below. This arrangement can be made from individual pieces which are bonded together or can be machined from a single piece of the conductive oxide. Cost, availability, and operational considerations will dictate which approach is used.

In general, any of the aforementioned classifications of materials (i.e. conductive or superconductive oxides) which exhibit a secondary emission ratio (δ) greater than 1 may be used. A few examples include materials such as yttrium barium cupric oxide (YBCO); cerium neodymium cuptic oxide ($Ce_xNd_{2-x}CuO_{4-Y}$); praseodymium neodymium cuptic oxide ($Pr_xNd_{2-x}CuO_{4-Y}$); terbium neodymium cuptic oxide.

The examples above have a secondary emission ratio (δ) which varies from material to material and further which varies in accordance with composition. Thus, exact composition and stoichiometry for these materials is not necessary to practice the invention. In fact, for certain materials, it may turn out that the optimum material may not have the correct stoichiometry and composition to be classified as a superconducting oxide. However as mentioned above, it is not necessary that the cathode 11 be superconducting, it is only necessary that the secondary emitter electrode 129e (i.e. layer or solid cathode) have sufficient conductivity at the operating temperature of the cathode 11 to leak off accumulated electron charge to ensure continued secondary emission.

Specific data on secondary emission ratio (8) taken for the materials mentioned above are shown in the tables below.

| Example | YBCO Firing | >(δ) at 500 V |
|---|---|---|
| Film on $YZ_rO$ | — | 1.8 |
| Film on $YZ_rO$ | $10^{-6}$ TORR, 550° C., 8 hours | 0.95 |
| Bulk | — | 1.8 |
| Bulk | $10^{-6}$ TORR, 550° C., 8 hours | 1.0 |

| X | (δ) at 500 V-600 V |
|---|---|
| | $Ce_XNd_{2-X}CuO_{4-Y}$ |
| 0.1 | 2 |
| 0.14 | 1.1 |
| 0.14 | 0.9 |
| 0.15 | 2.3 |
| 0.15 | 1.2 |
| 0.15 | 1.2 |
| 0.18 | 0.9 |
| 0.18 | 0.8 |
| 0.2 | 1.0 |
| 0.4 | 0.84 |
| | $Pr_XNd_{2-X}CuO_{4-Y}$ |
| 0.15 | 1.4 |
| 0.2 | 0.9 |
| 0.4 | 1.1 |
| | $Tb_{0.2}Nd_{2-X}CuO_{4-Y}$ |
| 0.2 | 0.95 |
| 0.4 | 0.85 |

The above materials may be characterized as rare earth substituted cupric oxides. For example, YBCO can be characterized as a yttrium barium substituted cupric oxide. Furthermore, the other materials, such as CeNdCuO and PrNdCuO and so forth can be characterized as rare earth substituted neodymium cupric oxides. However, other types of conductive and superconductive materials can be used. For example, rare earth substituted nickel oxides of the type $La_{2-x}Sr_xNiO_4$ which become superconducting at temperatures as high as 70° K may alternatively be used. Furthermore, other nickel oxide rare earth substituted materials similar to the copper oxide materials mentioned above, could alternatively be used.

To determine optimum materials and other materials other than those mentioned above, it is only necessary to determine the secondary emission ratio (δ) properties of these materials at the elevated temperature of operation expected to be encountered during operation of the tube 10. That the secondary emission ratio (δ) can be determined using a technique as described in conjunction with a paper entitled "Simulation of Rod charging in TWT Helix Structures" by A. Dallos, et al., IEDM 89-199-202. Further, the electrical conductivity of such material may also be determined at such elevated temperatures. Knowledge of secondary emission ratio (δ) and electrical conductivity (a) will enable a person of ordinary skill in the art to choose other materials besides those mentioned above as being examples preferred materials.

As shown clearly in FIG. 1 and FIG. 2, the cylindrical spool 29 has a region between wall 29c and pipe 25 which is filled with a liquid coolant such as water for cooling of the cathode structure 11. For cooling purposes water enters an inlet 25a of pipe 25 passes along the interior of pipe 25 an exit port 25c where the water fills the region 30. The water in region 30 exits through port 25b which is connected to the interior of a pipe 25d which has an exit port 25e through which the cooling water exits. Pipe 25 has a threaded end portion 25' and engaging nut 25" to which the negative terminal of a high voltage power supply (not shown) is typically attached with the anode 12 being typically connected to a ground potential.

Surrounding the outer wall 18 of the microwave cavity 15 (FIG. 1) is a concentric wall 30 which, in conjunction with extensions of the upper and lower walls 16, 17, respectively, of cavity 15 forms a chamber 31 through which water ($H_2O$) shown in FIG. 1 and 2 flows in order to provide cooling for the anode 12. Ports 43a and 43b (FIG. 1) provide entry points to the chamber 31 through which the water enters and exits, respectively.

The crossed-field amplifier tube 10 is shown in FIG. 1 and 2 without a magnet pieces which are generally required in order to provide a longitudinal directed magnetic field in the interaction region 35 which lies between the cathode secondary emission material layer 29e and the vanes 28. The magnets pieces are provided with north and south poles facing and are slid into recesses 23' and 24', respectively of the magnetic structures 23 and 24.

Figure 3:
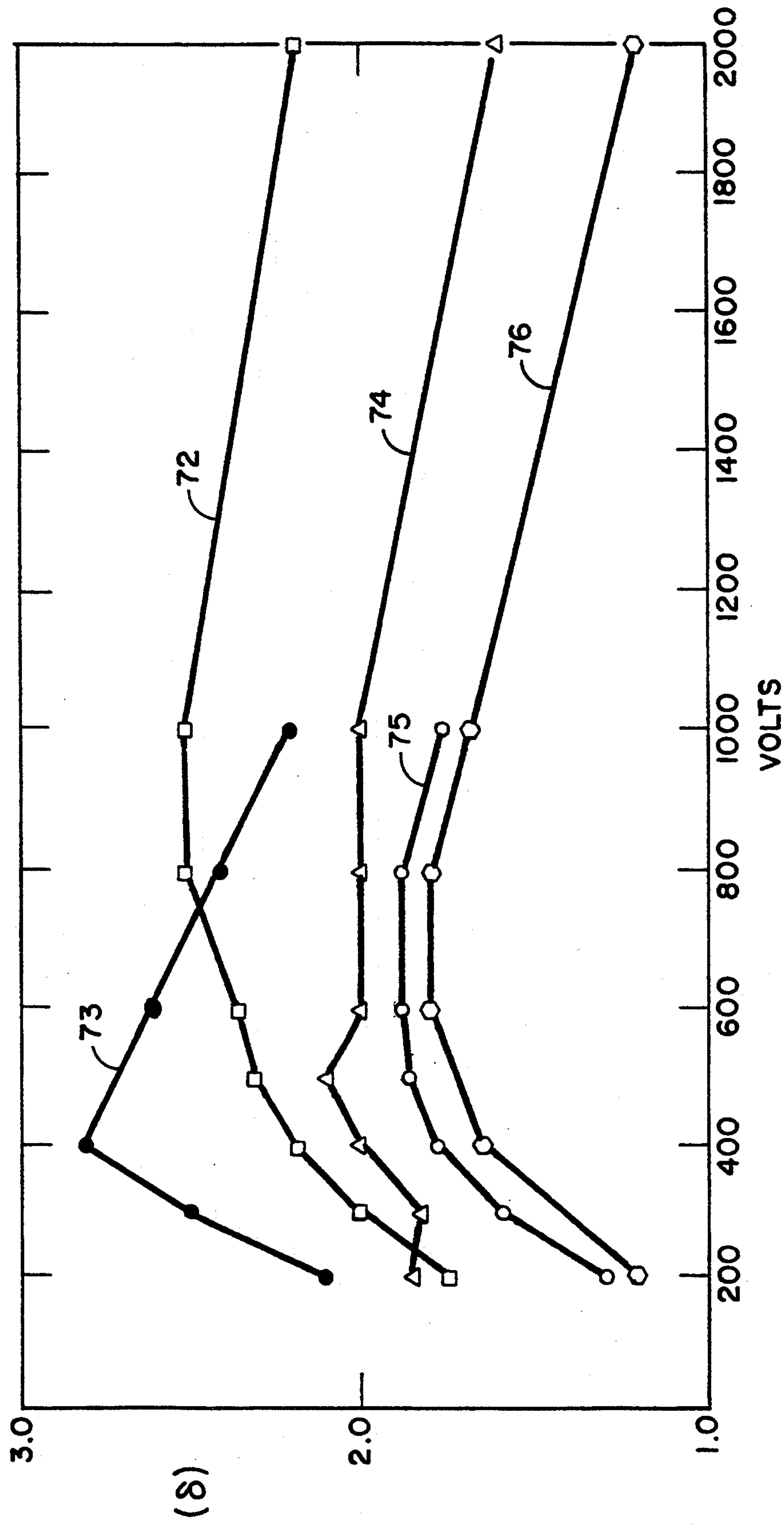
FIG. 3 is a plot of secondary emission ratio (δ) versus voltage for several superconducting oxides.

Referring now to FIG. 3, a plot of secondary emission ratio (secondary electrons emitted/primary electrons emitted) versus applied voltage is shown for cerium neodymium copper oxide $Ce_xNd_{2-x}CuO_Y$ (curves 72, 74) $W_{0.8}Th_{0.22}O$ (curve 76) in comparison with conventional BeO/Be (curve 73); and conventional Pt (curve 75). It is to be noted that. for optimum secondary emission performance, particularly in devices such as crossed-field amplifier tubes, it is desirable to have a δ characteristic which has a relatively high amplitude (i.e. substantially >1) and, furthermore which is relatively broadband as a function of applied voltage. That is, it is preferred that the secondary emission characteristic be relatively high over a broad range of voltages from approximately 200 volts up to beyond 2 kilovolts, for example. Each of the superconductive material types shown in conjunction FIG. 3 provide this desired arrangement. It should be added that although the (6) does not exceed that of BeO (for the examples shown), nevertheless there are several advantages which can be provided by the use of a secondary emitter of (CeNdCuO). For example, it obviates the need for use of easily erodible thin films since tunnelling of electrons (i.e. as for BeO) is not relied upon for secondary emission maintenance. Further use of these conductive oxides permits the secondary emitter cathodes to be provided from solid members of the conductive superconducting type of oxide and thus obviates the need for composite cathodes of an oxide over a metal.

Figure 4:
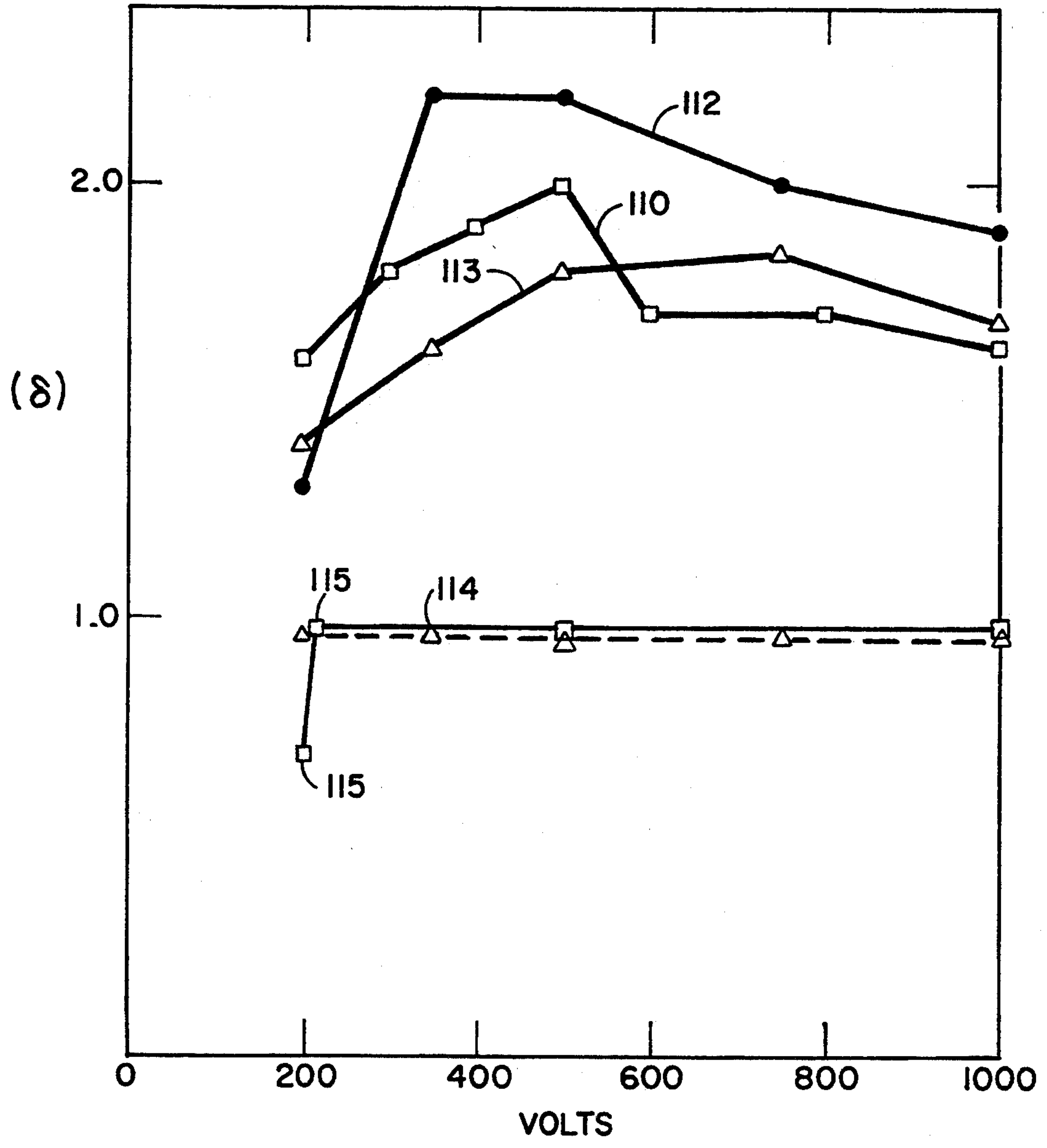
FIG. 4 is a plot of secondary emission ratio (δ) versus applied voltage for a yttrium boron copper oxide on zirconium oxide substrates versus applied voltage.

Referring now to FIG. 4, a plot of observed secondary emission ratios versus applied voltage for various conditions for a (yttrium barium copper oxide) material is shown. As also noted, the secondary emission ratio generally is shown to extend between 200 and 1,000 volts with a secondary emission ratio substantially>1. The composition of yttrium barium copper oxide is ($Y_1Ba_2Cu_3O_x$) and is generally provided from a company called Super Conductive Components, Inc., Columbus, Ohio. Curve 110 shows the initial secondary emission ratio observed on a film of yttrium barium cupric oxide. Curve 112 is a second observation made on the same film after the film was exposed to air. Curve 113 is the observation made after the film was exposed to an oxidizing atmosphere at an elevated temperature of 800° C. Curves 114 and 115 are the observations made after the bulk layers of YBaCuO were exposed to air at 800° C. (Curve 114) and $H_2$ and $Co_2$ at 800° C. (Curve 115). It is apparent for the latter curves that exposure to air and $H_2$ and $CO_2$ environments should be avoided for the (YBaCuO) material.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A cathode comprised of a superconductive oxide having a secondary emission ratio greater than 1.

2. The cathode of claim 1 wherein said cathode is comprised of a solid member of the superconductive oxide.

3. The cathode of claim 1 wherein said superconductive oxide is selected from the group consisting of YBaCuO; CeNdCuO; PrNdCuO; TbNdCuO, and other rare earth substituted neodymium cupric oxide materials.

4. The cathode of claim 1 wherein said superconductive oxide is provided as a thin layer over a metal support.

5. A vacuum tube device comprising:

a cathode comprised of a superconductive oxide material having a secondary emission ratio greater than 1; and an anode disposed adjacent said cathode.

6. The vacuum tube device, as recited in claim 5, wherein said cathode further comprises a layer of said superconductive oxide material disposed over a conductive metal.

7. The vacuum tube device, as recited in claim 6, wherein said super-conductive oxide material is selected from the group consisting of YBaCuO, CeNdCuO, PrNdCuO, TbNdCuO, and other rare earth substituted neodymium cupric oxide materials.

8. A vacuum tube comprising:

a cathode comprised of a superconducting material having a secondary emission ratio greater than 1;

an anode having a slow wave structure disposed adjacent said cathode for providing an interaction space between said slow wave structure and said cathode; and a waveguide means coupled to said slow wave structure.

9. The tube, as recited in claim 8, wherein said superconducting material comprising said cathode is selected from the group consisting of YBaCuO, CeNdCuO, PrNdCuO, TbNdCuO, and other rare earth substituted neodymium cupric oxide materials.

10. The tube, as recited in claim 8, wherein said cathode has a thin film of said superconducting material and said cathode further comprises a conductive metal supporting said thin film.

* * * * *